(12) United States Patent
Chang et al.

(10) Patent No.: US 8,264,629 B2
(45) Date of Patent: Sep. 11, 2012

(54) LIQUID CRYSTAL DISPLAY

(75) Inventors: Tsu-Chiang Chang, Taipei (TW); Po-Yang Chen, Tainan (TW); Chao-Hui Wu, Kaohsiung (TW); Po-Sheng Shih, Xinzhu (TW)

(73) Assignee: Hannstar Display Corp., Taipei (TW)

( * ) Notice: Subject to any disclaimer, the term of this patent is extended or adjusted under 35 U.S.C. 154(b) by 377 days.

(21) Appl. No.: 12/580,919

(22) Filed: Oct. 16, 2009

(65) Prior Publication Data
US 2010/0245746 A1    Sep. 30, 2010

(30) Foreign Application Priority Data

Mar. 24, 2009    (TW) .............................. 98109533 A

(51) Int. Cl.
G02F 1/136    (2006.01)
G02F 1/1343    (2006.01)
(52) U.S. Cl. .......................................... 349/43; 349/39
(58) Field of Classification Search .................... 349/43, 349/39
See application file for complete search history.

(56) References Cited

U.S. PATENT DOCUMENTS 5,416,340 A *  5/1995  Yoshida et al. ................. 257/59
6,088,072 A *  7/2000  Lee ................................. 349/39
6,917,392 B2 * 7/2005  Hannuki et al. ................ 349/43

FOREIGN PATENT DOCUMENTS

CN    101109881 A    1/2008

OTHER PUBLICATIONS

Chinese Office Action issued on Oct. 19, 2011, 7 pgs, no English translation is available.

* cited by examiner

Primary Examiner — James Dudek
(74) Attorney, Agent, or Firm — Huffman Law Group, P.C.

(57) ABSTRACT

The present invention provides a method for forming a pixel element. The method comprises: forming a first patterned metal layer within the pixel area; forming an insulation layer on the first patterned metal layer; forming a semiconductor layer on the insulation layer; patterning the semiconductor layer to form bend seed generation portion; and forming a second metal layer to connect the semiconductor layer.

14 Claims, 12 Drawing Sheets

LIQUID CRYSTAL DISPLAY

BACKGROUND OF THE INVENTION

1. Field of the Invention

The present invention relates Liquid Crystal Display, and more particularly, to pixel element of Liquid Crystal Display.

2. Description of the Prior Art

The Liquid Crystal Display can be classified according to kinds of the liquid crystal, kinds of driving method, kinds of light source, and the like. One type of the Liquid Crystal Display—Optically Compensated Birefringence Liquid Crystal Display or Optically Compensated Bend Liquid Crystal Display, OCB LCD—has a quick response time so that it can provide fluent visions to the viewer.

Before normal operation, the liquid crystal molecules of the OCB LCD must be transformed from the splay state to the bend state. FIG. 1A and FIG. 1B respectively illustrate the splay state and bend state of the liquid crystal molecules of the OCB LCD, wherein FIG. 1A shows the splay state, and FIG. 1B shows the bend state.

As shown in FIGS. 1A and 1B, an OCB LCD 10 comprises a liquid crystal layer 11 arranged between a thin-film transistor substrate 13 and a color filter substrate 12. Before an electrical field is applied to the liquid crystal layer 11, the liquid crystal molecules of the liquid crystal layer 11 is arranged at splay state. When an electrical filed is applied to the liquid crystal layer 11, the liquid crystal molecules of the liquid crystal layer 11 are transformed to the bend state. This transformation process is typically called as "start up" procedure. The OCB LCD cannot be normally operated until the "start up" procedure is completed. A conventional OCB LCD typically needs several minutes for carrying out the start up procedure, and always the user is impatient to wait.

As shown in FIG. 2, U.S. Pat. No. 6,597,424 discloses a pixel element of an OCB LCD to speed the start up procedure. Data lines 21 and gate lines 22 define a pixel element, which comprises a pixel electrode 24 and a switch transistor 23 for driving the pixel electrode 24, where the pixel electrode 24 has recess portions 25a and protrusion portions 25b at the neighborhood of its edges, and the data lines 21 and gate lines 22 have corresponding protrusion portions 26a/27a and recess portions 26b/27b. Some potential differences are applied between the pixel electrode 24 and the data lines 21 and between the pixel electrode 24 and the gate lines 22, thereby forming a transverse electric field to generate bend seeds that can help the transformation of the state of the liquid crystal layers, so that the start up procedure can be accelerated.

Although the above pixel element can speed the start up procedure, the aperture ratio is inevitably decreased. Because the shape of the protrusion portions 25b/26a/27a and the recess portions 25a/26b/27b are irregular, it is needed to be covered by a black matrix having the same irregular shape but a more large area, and therefore the aperture ratio is decreased.

Therefore, it would be advantageous to provide a pixel element and a method for producing the pixel element, which the start up procedure can be speeded and an excellent aperture ratio can be maintained.

SUMMARY OF THE INVENTION

The object of the present invention is to provide a pixel element of Liquid Crystal Display and its forming method, which can speed up the start up procedure, and maintain the aperture ratio of the Liquid Crystal Display.

According to the object, the present invention provides a method for forming a pixel element of a Liquid Crystal Display, comprising: forming a patterned first electrode layer within the pixel area of the Liquid Crystal Display; forming an insulation layer on the patterned first electrode layer; forming a semiconductor layer on the insulation layer; patterning the semiconductor layer to form a bend seed generation portion; and forming a patterned second electrode layer to connect the semiconductor layer.

According to the object, the present invention provides a pixel element of a Liquid Crystal Display, the Liquid Crystal Display comprising a pixel array defined by a plurality of data lines and a plurality of gate lines, each of the pixel element of the pixel array comprising: a gate line or a common line on a thin-film transistor substrate; an insulation layer on the gate line or the common line; a semiconductor layer having a plurality of bend seed generation portions on the insulation layer; and a data line on the semiconductor layer, the data line connecting to the semiconductor layer.

According to the object, the present invention provides a pixel element of a Liquid Crystal Display, the Liquid Crystal Display comprising a pixel array defined by a plurality of data lines and a plurality of gate lines, each of the pixel element of the pixel array comprising: a gate line or a common line on a thin-film transistor substrate; an insulation layer on the gate line or the common line; a semiconductor layer having a plurality of bend seed generation portions on the insulation layer; and a second electrode layer on the semiconductor layer, the second electrode layer connecting to the semiconductor layer.

DESCRIPTION OF THE PREFERRED EMBODIMENT

The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components. Wherever possible, the same or similar reference numbers are used in drawings and the description to refer to the same or like parts. It should be noted that any drawings presented are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawing. Such directional terms should not be construed to limit the scope of the invention in any manner.

The key to speed the start up procedure of the prior art is to generate bend seeds by altering the essential configuration of the pixel element, but the altered pixel element sacrifices the aperture ratio and complicates the manufacturing process. In view of the defects of the prior art, the present invention provides a pixel element and a method for producing the pixel element that can speed the start up procedure on conditions that the essential configuration of the pixel element is not altered, the manufacturing process is not complicated, and the aperture ratio can be maintained as before.

Figure 1A:
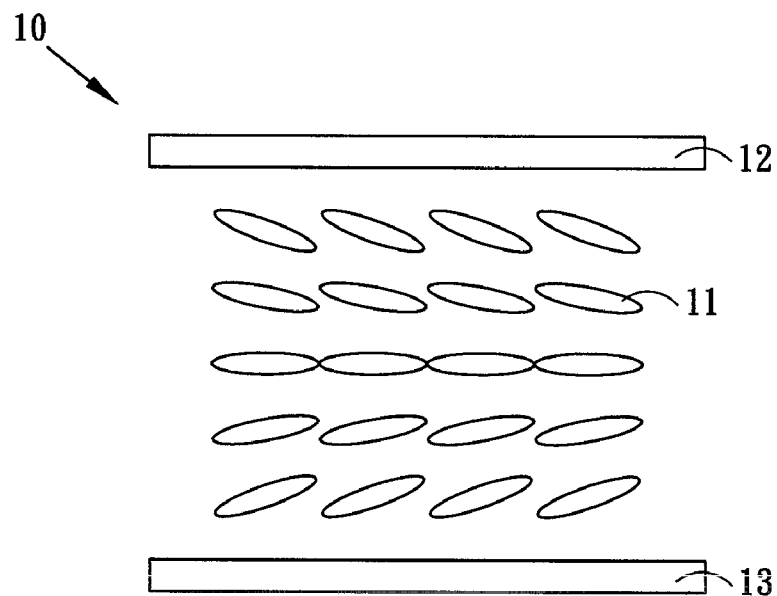
FIG. 1A and FIG. 1B show two states of liquid crystal molecules of a conventional OCB.
Figure 1B:
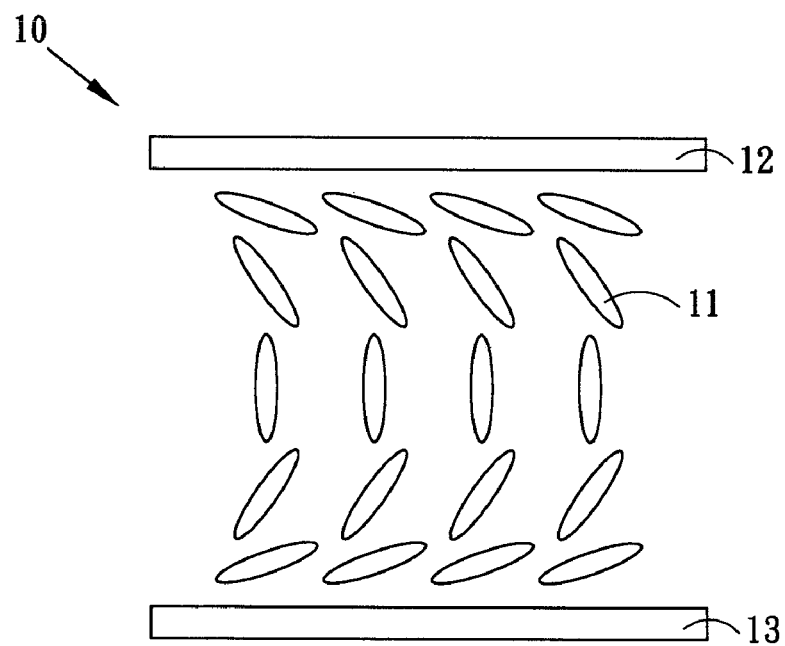
Figure 2:
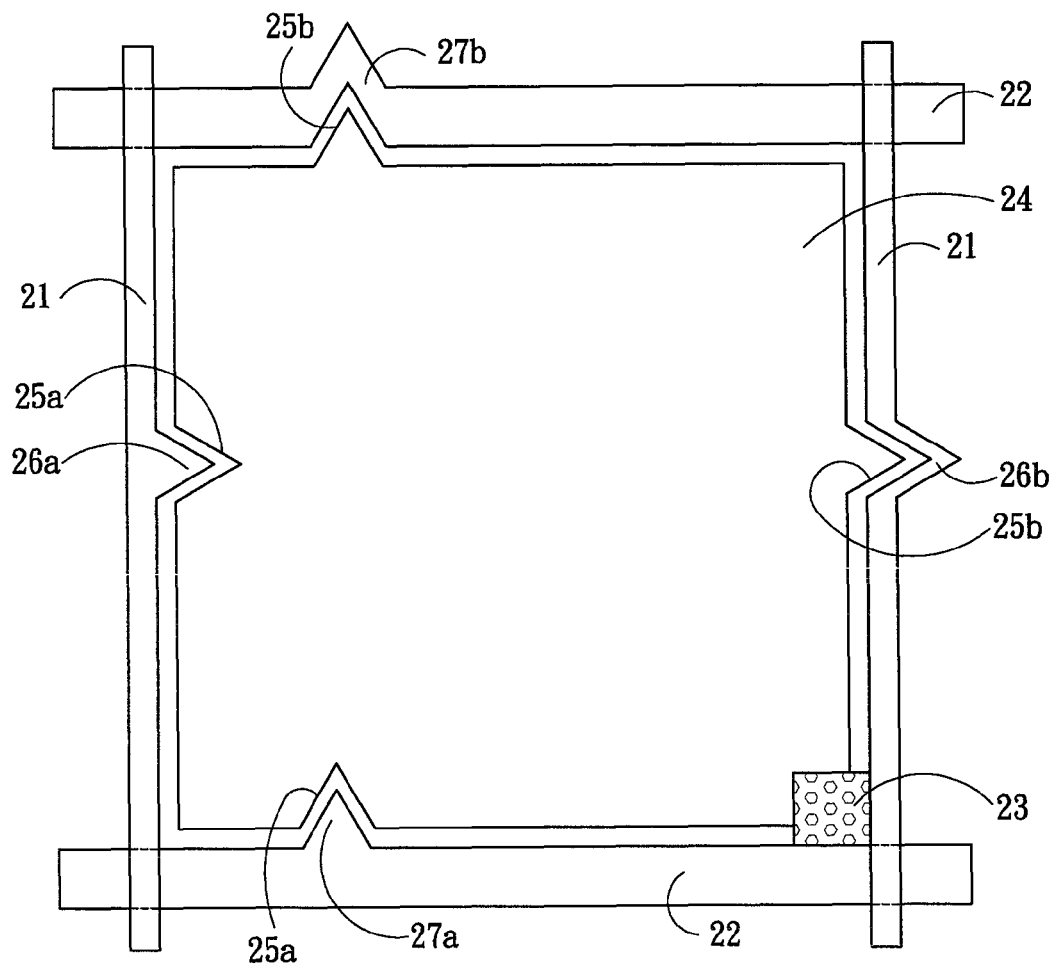
FIG. 2 is a diagram of a pixel element according to a conventional OCB.
Figure 3:
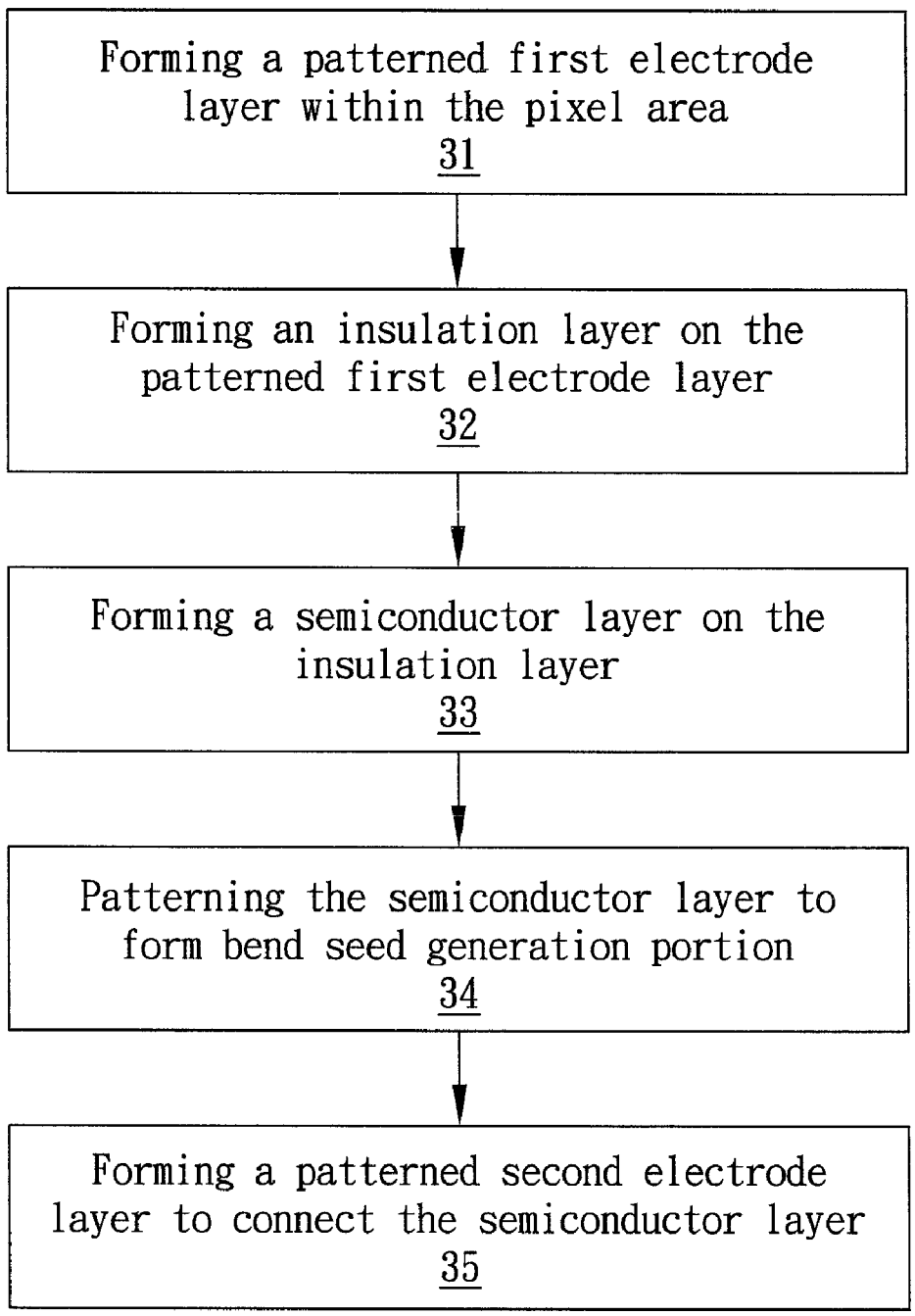
FIG. 3 and FIG. 4 show a method for forming a pixel element according to one embodiment of the present invention.

FIG. 3 shows a forming method of a pixel element according to one embodiment of the present invention. Step 31, a patterned first electrode layer is formed within the pixel area, where the first electrode layer and the gate lines can be formed in the same layer; or, the first electrode layer comprises a gate line or a common line (also referred to as bias line in the pixel element of Liquid Crystal Display). In this text, gate lines and data lines define the pixel area that comprises a central region and a boundary region. Generally two data lines and two gate lines define one (or more) pixel, and the first electrode layer may be formed at the central region and/or the boundary region. Step 32, an insulation layer is formed on the patterned first electrode layer. Step 33, a semiconductor layer is formed on the insulation layer. The semiconductor layer may be made from a material chosen from the group consisting of polycrystalline silicon, microcrystalline silicon, amorphous silicon, and combination thereof. Step 34, the semiconductor layer is patterned to form a plurality of bend seed generation portions. Step 35, a patterned second electrode layer is formed to connect the semiconductor layer. In one embodiment, the second electrode layer and the data lines are formed at the same layer and the second electrode layer is connected to at least one of the data lines, or, the second electrode layer comprises a data line or a capacitor electrode. In another embodiment, the second electrode layer comprises a pixel electrode, and a passivated layer is arranged between the pixel electrode and the semiconductor layer. The pixel electrode connects the semiconductor layer via at least a contact hole. It is appreciated that at least a portion or the whole of the semiconductor layer is right on the first electrode layer according to the present invention.

Figure 4:
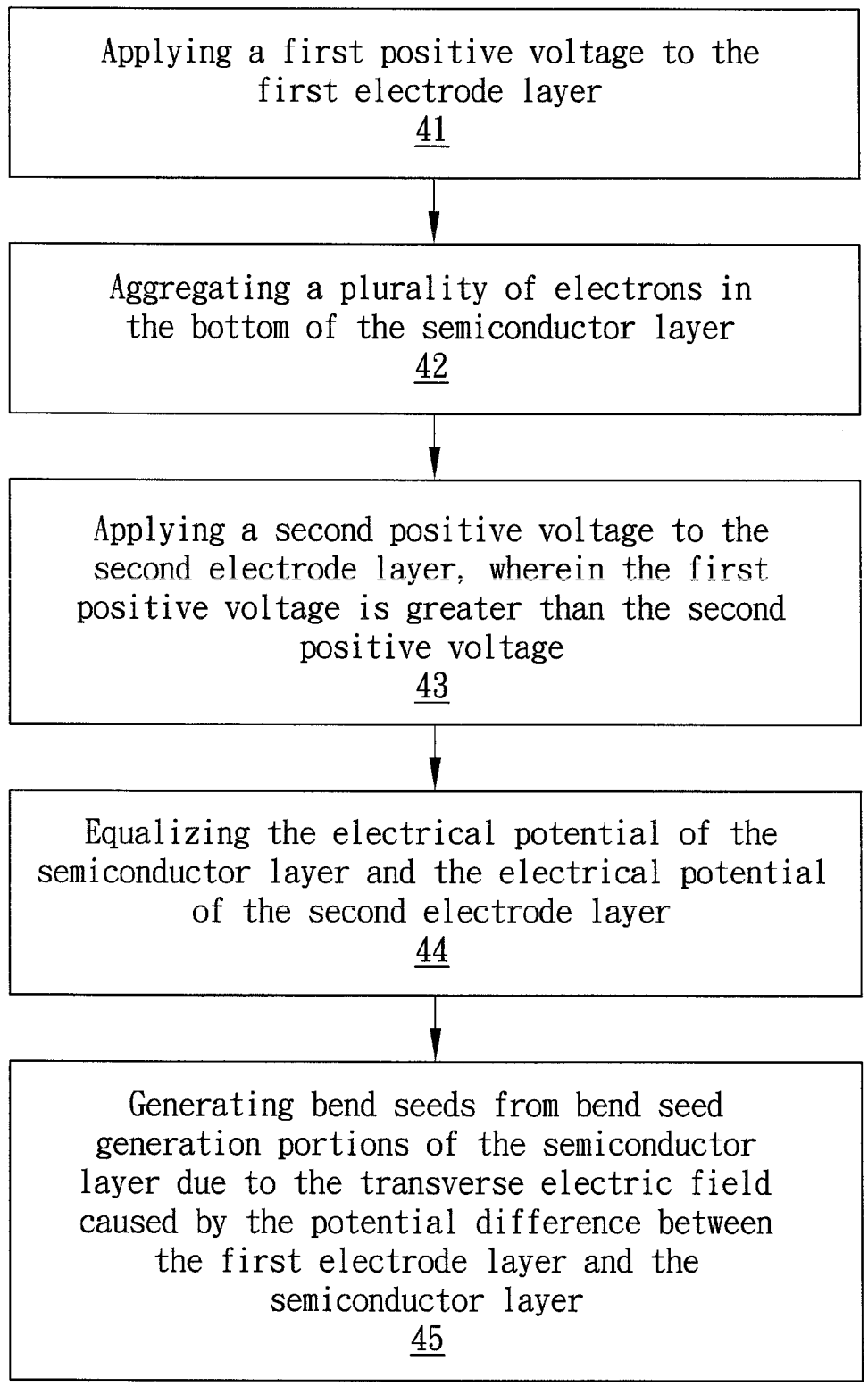

FIG. 4 shows a driving method applied to the pixel element produced by the method of FIG. 3 for accelerating the start up procedure. Step 41, a first positive voltage is applied to the first electrode layer. Step 42, a plurality of electrons having a polarity opposite to the first positive voltage are aggregated in the bottom of the semiconductor layer due to the exertion of the first positive voltage. Step 43, a second positive voltage is applied to the second electrode layer, wherein the first positive voltage is greater than the second positive voltage. Step 44, the electrical potential of the semiconductor layer equalizes the electrical potential of the second electrode layer, because the semiconductor layer now works as an electrical conductor. Step 45, bend seeds are generated from bend seed generation portions of the semiconductor layer due to the transverse electric field caused by the potential difference between the first electrode layer and the semiconductor layer.

In the above method, the performance of the semiconductor may be changed by at least one additional implanting process, which forms at least one doped region. For example, forming a N+ heavily doped region in the semiconductor layer may form an Ohmic contact between the semiconductor layer and the second electrode layer. In addition, the first positive voltage and/or the second positive voltage may be changed to a first negative voltage and/or a second negative voltage on a condition that the potential difference is sufficient to generate the bend seeds. Further, because the start up procedure differs from the normal operation, the voltages applied to the first and second electrode layer during the start up procedure may be different from the voltages applied to the first and second electrode layer during the normal operation. For example, if the first electrode layer comprises a gate line and the second electrode layer comprises a data line, then a voltage 10V to 15V may be applied to the gate line and a voltage 0 to 10V may be applied to the data line during the normal operation, and a voltage 40V may be applied to the gate line and a voltage 0 to 1V may be applied to the data line during the start up operation.

Figure 5A:
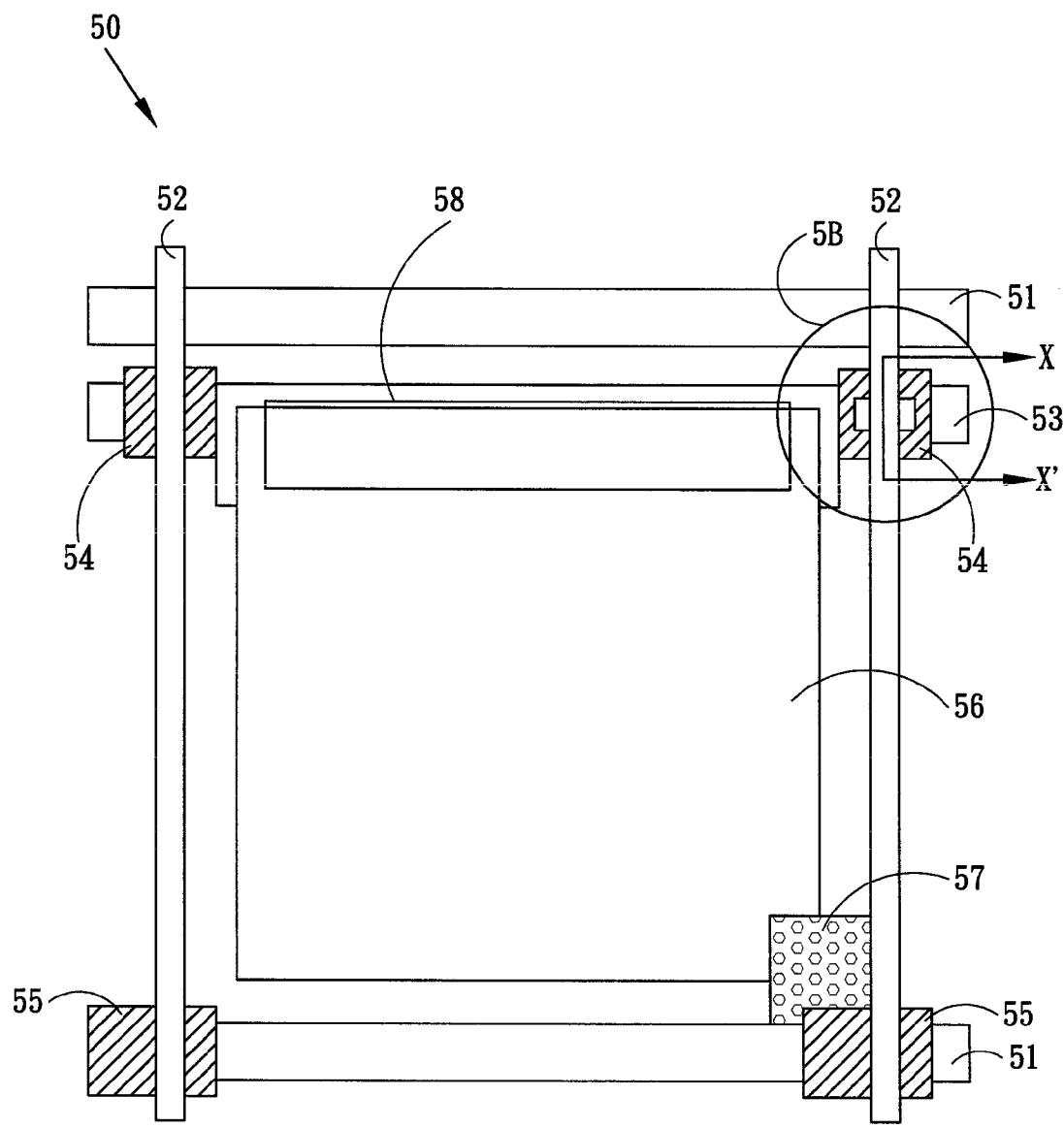
FIGS. 5A, 5B, 5C, 6, and 7 show a pixel element and its variation according to embodiments of the present invention.
Figure 5B:
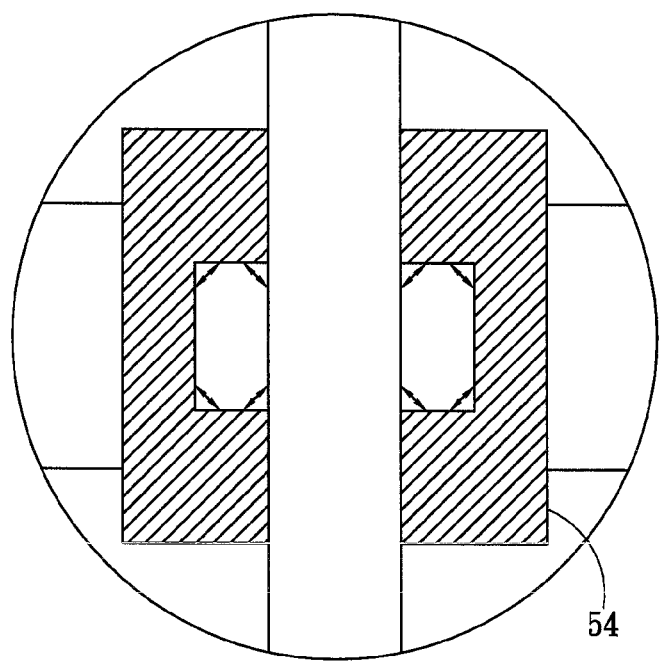
Figure 5C:
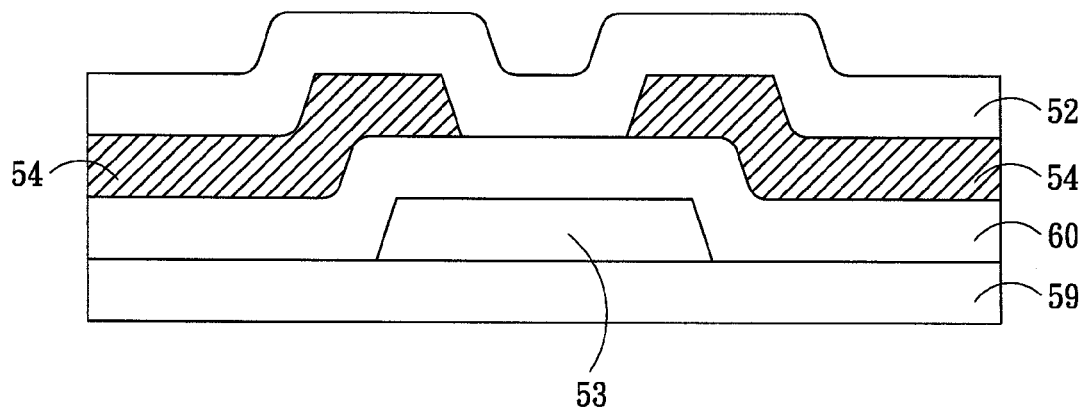

FIG. 5A to FIG. 5C show a pixel element according to one embodiment of the present invention, wherein FIG. 5B is a part enlarged view of FIG. 5A, FIG. 5C is a cross-sectional view of FIG. 5A taken along a line X-X'.

In the embodiment of FIG. 5A, two gate lines 51 and two data lines 52 define a pixel element 50, but this should not be limited. As mentioned above, a semiconductor layer 54/55 having bend seed generation portions may be formed in the boundary region of the pixel element. For example, a semiconductor layer 54 is formed between a common line 53 and a data line 52, or, a semiconductor layer 55 is formed between a gate line 51 and the data line 52. The pixel element 50 further comprises a pixel electrode 56 for driving the liquid crystal molecules and a thin-film transistor 57 for controlling the pixel electrode 56. The structure of the thin-film transistor 57 may be same as the structure of the prior art, which comprises a gate, a source, and a drain, or, the thin-film transistor 57 may be other type of switch elements. In addition, the pixel element 50 comprises a capacitor electrode 58, wherein the capacitor electrode 58 and the common line 53 construct a storage capacitor formed on the common line (typically called "Cst on common"). In other embodiments of the present invention, the storage capacitor of the pixel element 50 may be formed on the gate line (typically called "Cst on gate").

FIG. 5B illustrate the geometry of the semiconductor layer according to one embodiment of the present invention. For forming bend seed generation portions, the semiconductor layer 54 is hollowed to form at least one polygon-shaped opening. As shown in FIG. 5B, the eight double-arrow lines within the opening shown will be the bend seed generation portions. It is appreciated that the outline of the polygon-shaped may comprises obtuse angle, acute angle, right angle, and other irregular shapes. In addition, the different positions of the semiconductor layer may comprise the same or different shape of the bend seed generation portions. For example, the semiconductor layer 55 may has a shape different from (or same with) the shape of the semiconductor layer 54.

FIG. 5C is a cross-sectional view taken along the line X-X' of FIG. 5A. As shown in FIG. 5C, the common line 53 is formed on the substrate 59, the insulation layer 60 is formed on the common line 53, the semiconductor layer 54 having bend seed generation portions is formed on the insulation layer 60, and the data line 52 is formed on the semiconductor layer 54.

Figure 6:
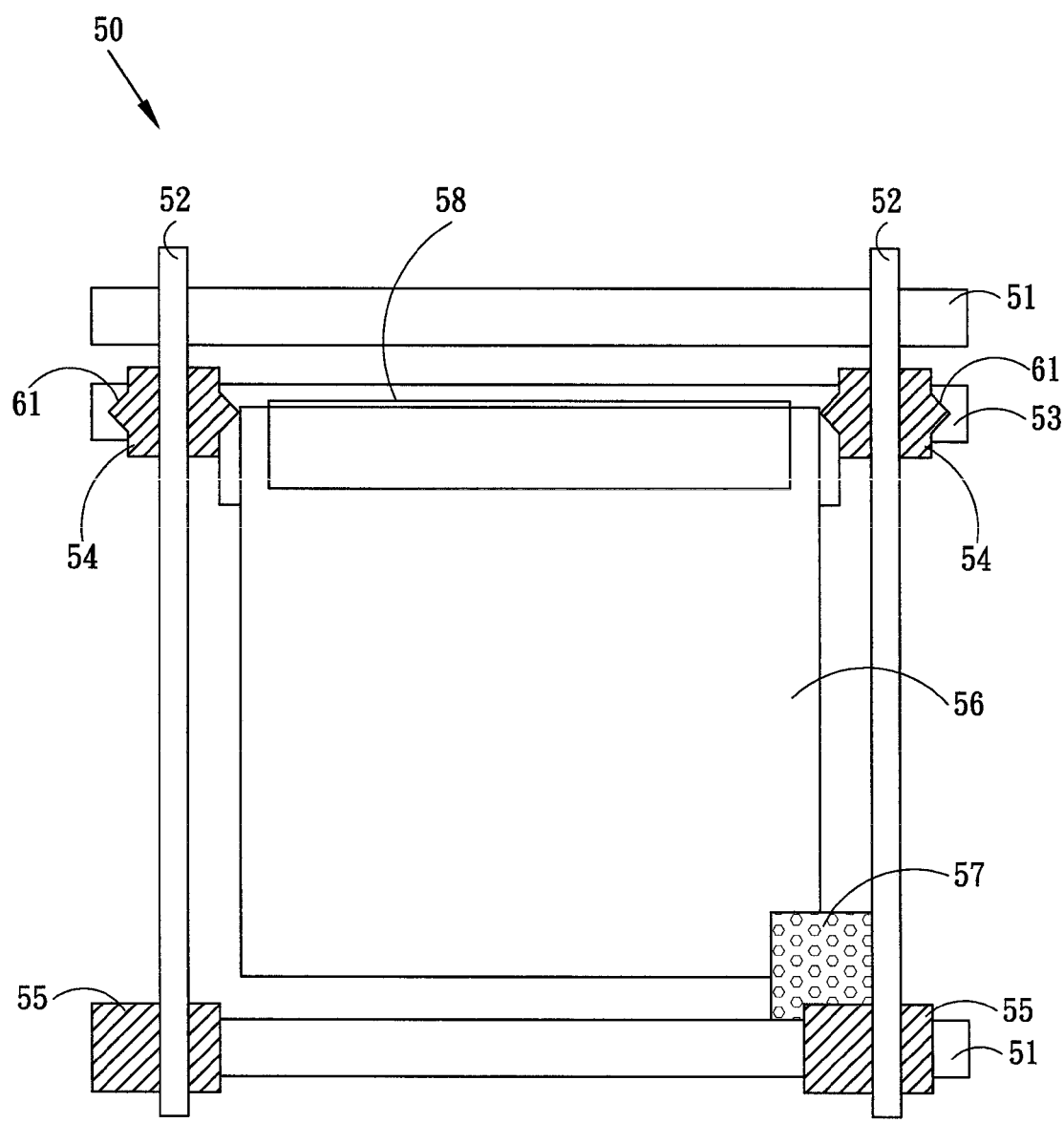
Figure 7:
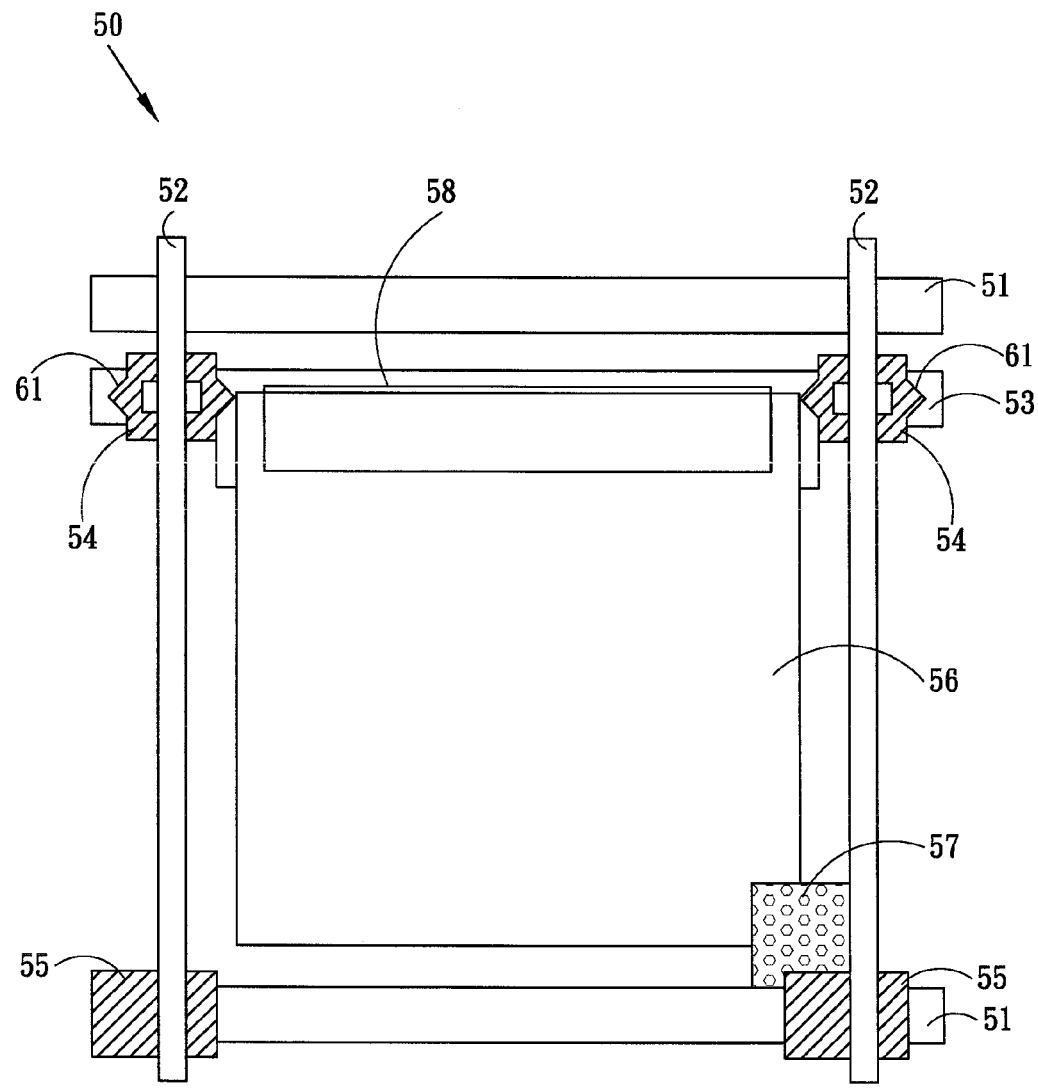

FIG. 6 and FIG. 7 illustrate two semiconductor layers having different shapes according to two embodiments of the present invention. For convenience, the same reference numbers are used in later embodiments to refer to the same elements mentioned before, and the same description of which are omitted. Referring to FIG. 6, the semiconductor layer 54 comprises at least one protrusion portion 61 as the bend seed generation portion. Referring to FIG. 7, the semiconductor layer 54 is hollowed to form at least one polygon-shaped opening, where the outline of the opening comprises obtuse angle, acute angle, right angle, and other irregular shapes, the outer outline of the semiconductor layer 54 comprises at least one protrusion portion, and all of these un-smooth shapes will function as the bend seed generation portions.

Figure 8A:
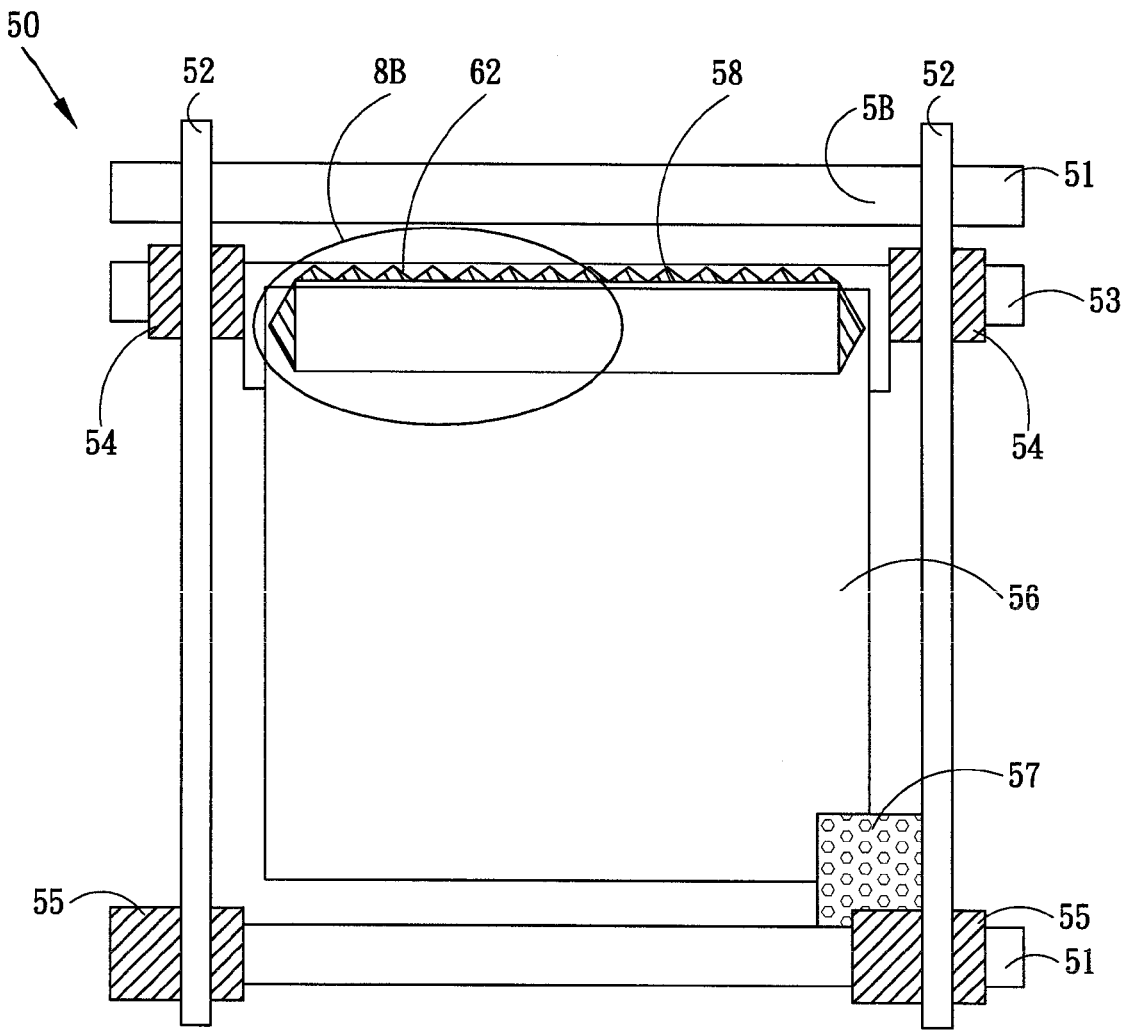
FIGS. 8A, 8B, 8C, 8D, 9A, 9B, 10A, and 10B show a pixel element and its variation according to other embodiments of the present invention.
Figure 8B:
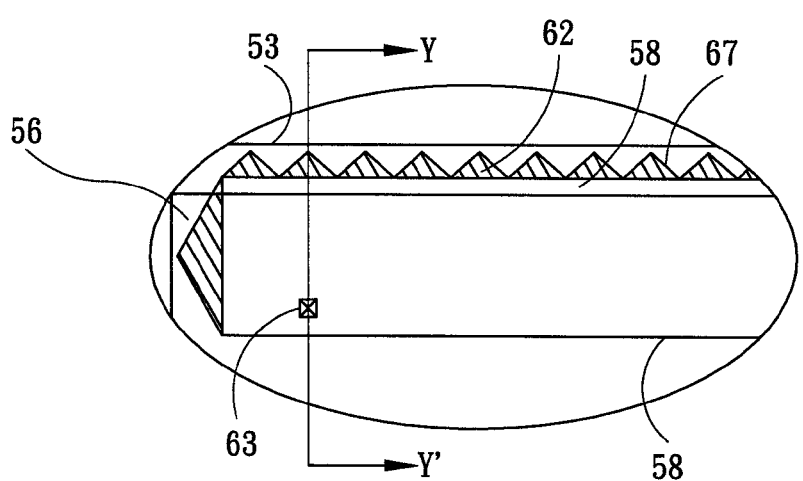
Figure 8C:
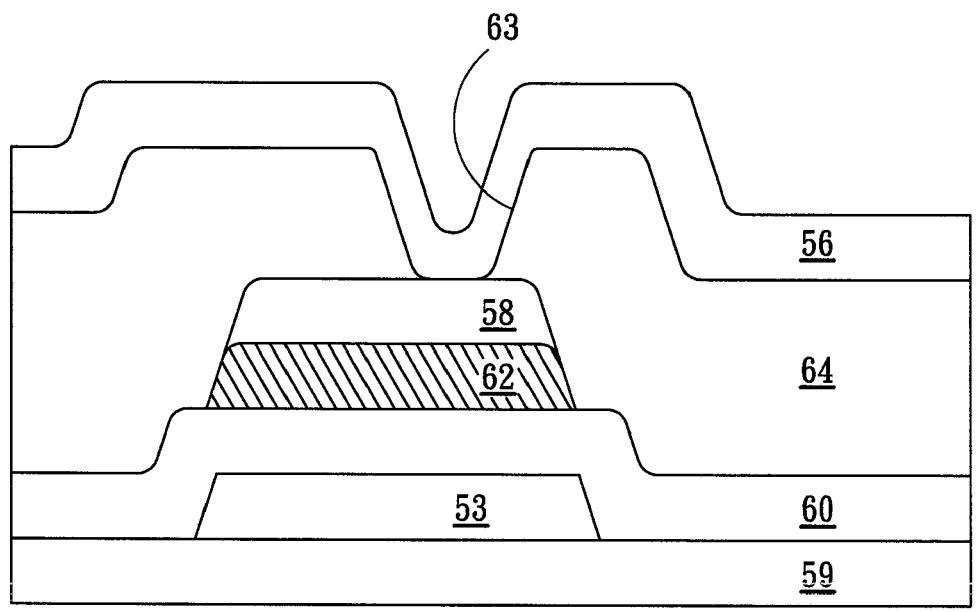

FIG. 8A to FIG. 8D illustrate that the semiconductor layer having bend seed generation portions may be formed in the storage capacitor of the pixel element, wherein FIG. 8B is a part enlarged view of FIG. 8A, and FIG. 8C is a cross-sectional view taken along a line Y-Y' of FIG. 8A.

Referring to FIG. 8A and FIG. 8B, the semiconductor layer 62 is arranged under the capacitor electrode 58, and the semiconductor layer 62 comprises protrusion portions 67 as the bend seed generation portions. The capacitor electrode 58 connects with pixel electrode 56 via the contact hole 63, so that the electrical potential of the capacitor electrode 58 equals the electrical potential of the pixel electrode 56.

Referring to FIG. 8C, which is a cross-sectional view taken along the line Y-Y' of FIG. 8A. The common line 53 is formed on a substrate 59, the insulation layer 60 is formed on the common line 53, the semiconductor layer 62 having bend seed generation portions is formed on the insulation layer 60, the capacitor electrode 58 is formed on the semiconductor layer 62, a passivated layer 64 is formed on the capacitor electrode 58, and a pixel electrode 56 is formed on the passivated layer 64 and is connected with the capacitor electrode 58 via a contact hole 63.

Figure 8D:
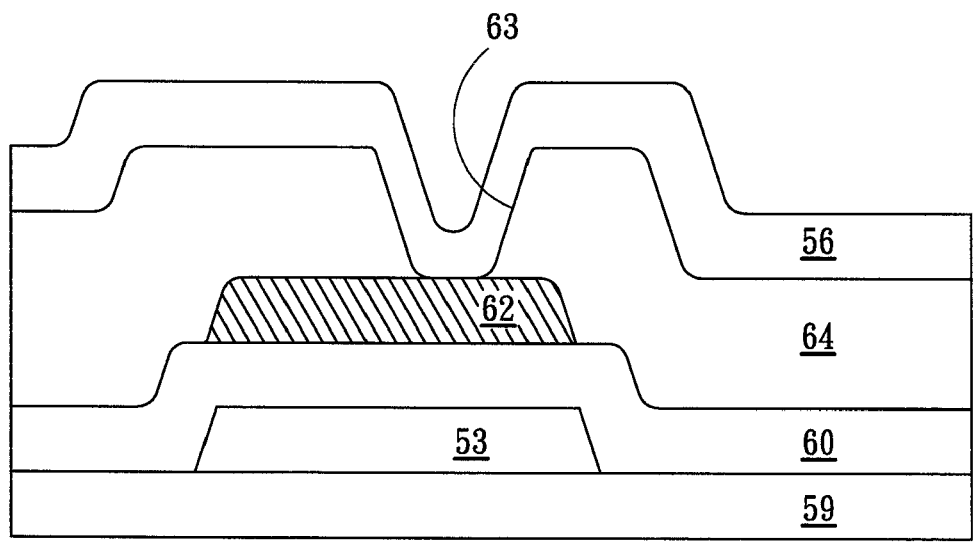

The semiconductor layer 62 of FIG. 8C is formed within a "MIM" (Metal/Insulation/Metal) type of storage capacitor, where the common line 53 and capacitor electrode 58 as two electrodes of the storage capacitor, and the semiconductor layer 62 having bend seed generation portions is formed under the capacitor electrode 58. FIG. 8D shows another embodiment of the present invention in which the capacitor electrode 58 is omitted, and the pixel electrode 56 functions as another electrode of the storage capacitor and connects with the semiconductor layer 62 via the contact hole 63.

Figure 9A:
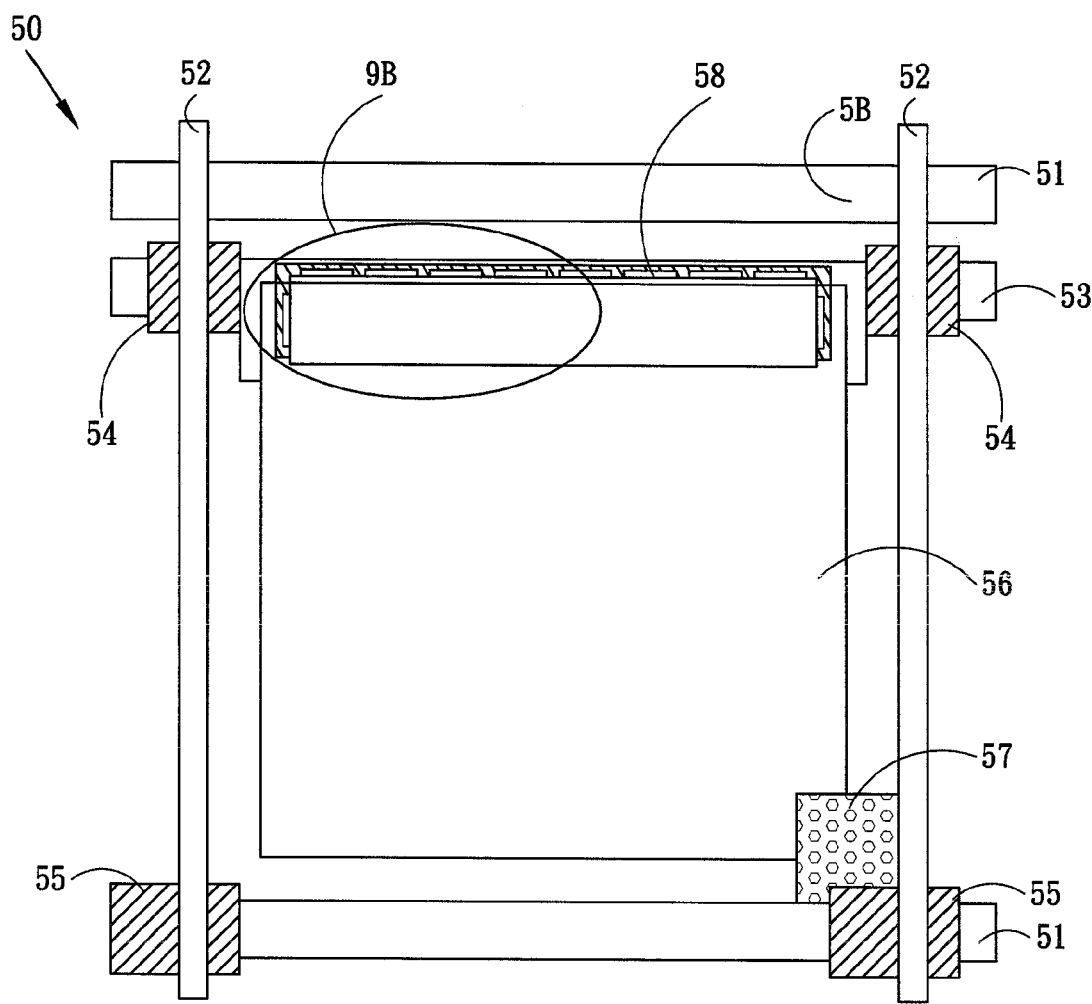
Figure 9B:
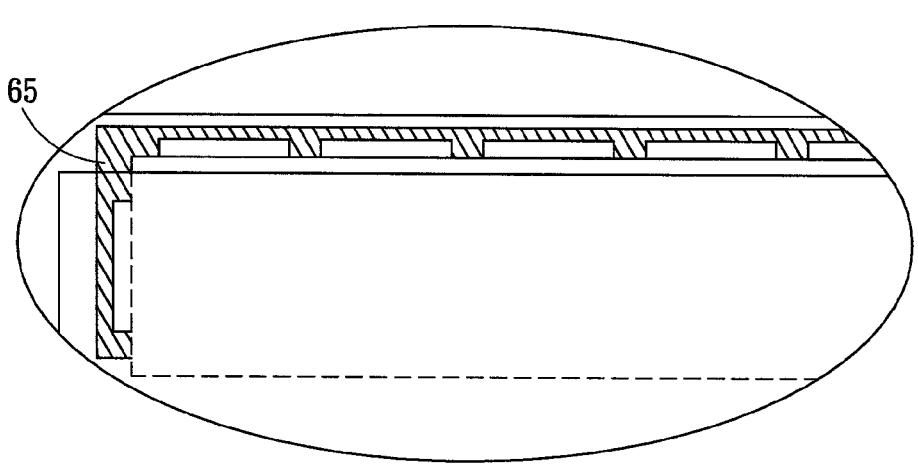

FIG. 9A and FIG. 9B illustrate the geometry of the semiconductor layer according to another embodiment of the present invention, wherein FIG. 9B is a part enlarged view of FIG. 9A. The semiconductor layer 65 is hollowed to form at least one polygon-shaped opening, where the outline of the opening comprises obtuse angle, acute angle, right angle, and other irregular shapes as bend seed generation portions.

Figure 10A:
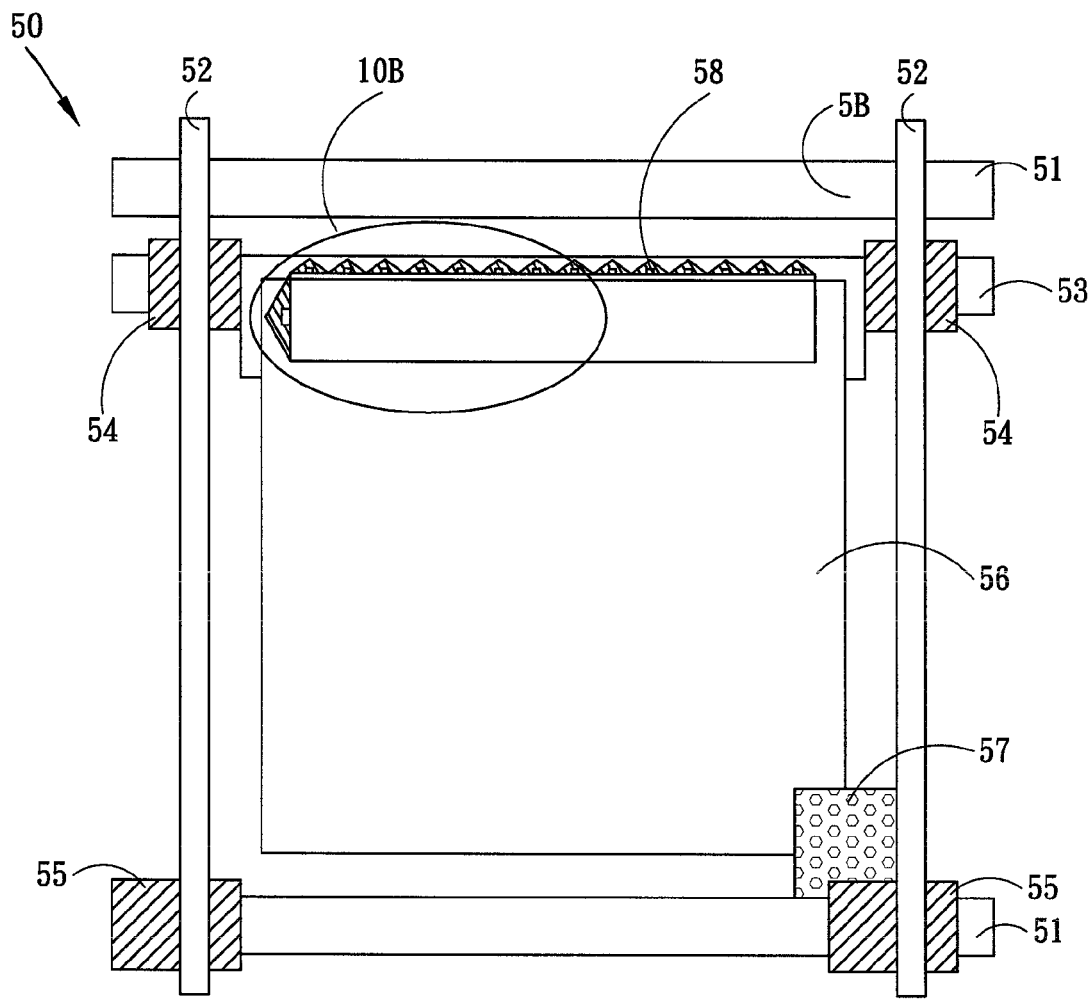
Figure 10B:
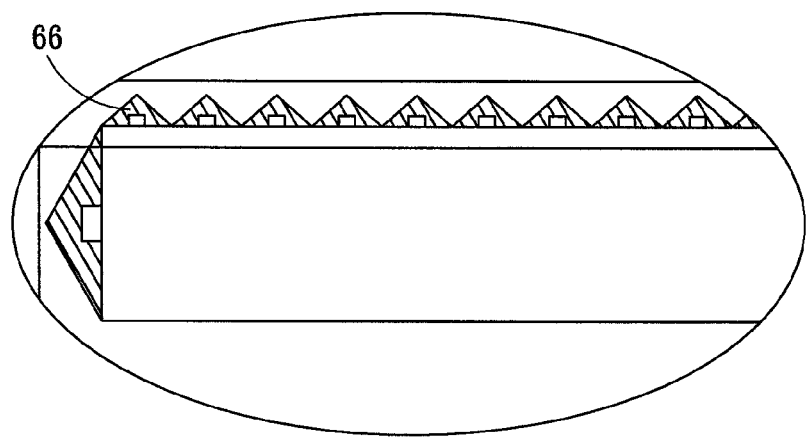

FIG. 10A and FIG. 10B illustrate the geometry of the semiconductor layer according to another embodiment of the present invention, wherein FIG. 10B is a part enlarged view of FIG. 10A. The semiconductor layer 66 is hollowed to form at least one polygon-shaped opening, where the outline of the opening may comprise obtuse angle, acute angle, right angle, and other irregular shapes, the outer outline of the semiconductor layer 54 comprises at least one protrusion portion, and all of these un-smooth shapes will function as the bend seed generation portions.

The above-mentioned embodiments illustrate variant geometry of the semiconductor layer, but it is should not be limited by the drawings. In addition, the geometry of FIG. 8A to FIG. 10B may be applied in a storage capacitor that is formed on the gate (typically called "Cst on gate"). The only difference compared with the Cst on gate structure is that the gate line will be another reference electrode instead of the common line; therefore the description and drawings are omitted for simplicity and clarity.

The method of FIG. 4 can be applied to all above-mentioned embodiments of the present invention; the only difference between embodiments is that the first electrode layer and the second electrode layer may be different and they may connect to different elements so that they have different electrical potentials. For embodiment of FIG. 5C, the first electrode layer corresponds to the common line, the second electrode layer corresponds to the data line, and the electrical potential of the data line equals the electrical potential of the semiconductor layer; for embodiment of FIG. 8C, the first electrode layer corresponds to the common line, the second electrode layer corresponds to the capacitor electrode, and the electrical potential of the pixel electrode equals the electrical potential of the capacitor electrode and the electrical potential of the semiconductor layer; for embodiment of FIG. 8D, the first electrode layer corresponds to the common line, the second electrode layer corresponds to pixel electrode, and the electrical potential of the pixel electrode equals to the electrical potential of the semiconductor layer via the contact hole.

The pixel element and the method for producing the pixel element according to the present invention can be applied to a Liquid Crystal Display, which comprises a thin-film transistor substrate and a color filter substrate, wherein the pixel element is arranged within the thin-film transistor substrate. The color filter substrate comprises a common electrode. An electrical field is applied between the common electrode and the pixel electrode of the thin-film transistor substrate for driving the liquid crystal molecules between two substrates. According to the pixel element and its forming method of the present invention, the potential difference between the first electrode layer and the second electrode layer generates transverse electrical filed, so that the bend seed generation portions of the semiconductor layer generate a plurality of bend seeds, and by an electrical field applied between the two substrates, the bend seeds help the all liquid crystal molecules to be transformed completely, thereby speeding up the start up procedure. The experiment results show that the start up procedure of the OCB LCD of the present invention can be completed less than 3 seconds, even less than 1 second.

According to the pixel element and its forming method of the present invention, the pixel electrode is needless to be altered, and because the area of the bend seed generation portions is quite small, the aperture ratio is almost unchanged. In addition, the method of producing the pixel element of the application is compliant with current manufacturing method. For example, the step 33 for forming a semiconductor layer on the insulation layer is the same step for forming a semiconductor layer of the thin-film transistor, so that no any further step is needed. Accordingly, the pixel element and its producing method of the present invention is indeed an excellent solution for speeding up the start up procedure.

Although specific embodiments have been illustrated and described, it will be appreciated by those skilled in the art that various modifications may be made without departing from the scope of the present invention, which is intended to be limited solely by the appended claims.

What is claimed is:

1. A Liquid Crystal Display, said Liquid Crystal Display comprising a pixel array formed on a thin-film transistor substrate and defined by a plurality of data lines and a plurality of gate lines, said pixel array comprising a plurality of pixel elements and each pixel element comprising:

a gate line or a common line formed on said thin-film transistor substrate;

an insulation layer formed on said gate line or said common line;

a semiconductor layer having a plurality of bend seed generation portions formed on said insulation layer;

a data line formed on said semiconductor layer, said data line connecting to said semiconductor layer; and a thin-film transistor, comprising a gate, a source, and a drain;

wherein said semiconductor layer having said bend seed generation portions is located at the intersection of said data line and said gate line or located at the intersection of said data line and said common line, and during a start-up operation, said data line and said gate line or said data line and said common line generates a transverse electrical field, and whereby said bend seed generation portions generate bend seeds to transform a state of a liquid crystal layer from a splay state to a bend state.

2. The Liquid Crystal Display as recited in claim 1, wherein a normal operation is performed after the start-up operation, a first voltage is supplied to said gate line or said common line during the start-up operation, a second voltage is supplied to said gate line or said common line during the normal operation, and the first voltage is greater than the second voltage.

3. The Liquid Crystal Display as recited in claim 1, wherein said semiconductor layer is hollowed to form at least one polygon-shaped opening, and the outline of the polygon-shaped opening comprises obtuse angle, acute angle, right angle, or other irregular shapes as said bend seed generation portion.

4. The Liquid Crystal Display as recited in claim 1, wherein the outer outline of said semiconductor layer comprises at least one protrusion portion as the bend seed generation portion.

5. The Liquid Crystal Display as recited in claim 1, wherein said semiconductor layer is hollowed to form at least one polygon-shaped opening, the outline of the opening comprises obtuse angle, acute angle, right angle, or other irregular shapes as the bend seed generation portion, and the outer outline of said semiconductor layer comprises at least one protrusion portion as the bend seed generation portion.

6. The Liquid Crystal Display as recited in claim 1, wherein at least a portion of said semiconductor layer is right on said first electrode layer.

7. A Liquid Crystal Display, said Liquid Crystal Display comprising a pixel array formed on a thin-film transistor substrate, said pixel array comprising a plurality of pixel elements and each pixel element comprising:
- a gate line or a common line formed on said thin-film transistor substrate;
- an insulation layer formed on said gate line or said common line;
- a semiconductor layer having a plurality of bend seed generation portions formed on said insulation layer;
- a second electrode layer formed on said semiconductor layer, said second electrode layer connecting to said semiconductor layer; and
- a thin-film transistor, comprising a gate, a source, and a drain;

wherein said semiconductor layer having said bend seed generation portions is located between said gate line and said second electrode layer or located between said common line and said second electrode layer, and during a start-up operation, said second electrode layer and said gate line or said second electrode layer and said common line generate a transverse electrical field, and whereby said bend seed generation portions generate bend seeds to transform a state of a liquid crystal layer from a splay state to a bend state.

8. The Liquid Crystal Display as recited in claim 7, wherein said second electrode layer comprises a capacitor electrode, and further comprises a passivated layer on said capacitor electrode and a pixel electrode on said passivated layer, said pixel electrode connecting with said capacitor electrode via a contact hole.

9. The Liquid Crystal Display as recited in claim 7, wherein said second electrode layer comprises a pixel electrode, and further comprises a passiveted layer between said semiconductor layer and said pixel electrode, said pixel electrode connecting with said semiconductor layer via a contact hole.

10. The Liquid Crystal Display as recited in claim 7, wherein a normal operation is performed after the start-up operation, a first voltage is supplied to said gate line or said common line during the start-up operation, a second voltage is supplied to said gate line or said common line during the normal operation, and the first voltage is greater than the second voltage.

11. The Liquid Crystal Display as recited in claim 7, wherein said semiconductor layer is hollowed to form at least one polygon-shaped opening, and the outline of the polygon-shaped opening comprises obtuse angle, acute angle, right angle, or other irregular shapes as said bend seed generation portion.

12. The Liquid Crystal Display as recited in claim 7, wherein the outer outline of said semiconductor layer comprises at least one protrusion portion as the bend seed generation portion.

13. The Liquid Crystal Display as recited in claim 7, wherein said semiconductor layer is hollowed to form at least one polygon-shaped opening, the outline of the opening comprises obtuse angle, acute angle, right angle, or other irregular shapes as the bend seed generation portion, and the outer outline of said semiconductor layer comprises at least one protrusion portion as the bend seed generation portion.

14. The Liquid Crystal Display as recited in claim 7, wherein at least a portion of said semiconductor layer is right on said first electrode layer.

* * * * *